United States Patent
Lamson et al.

(10) Patent No.: US 9,030,216 B2
(45) Date of Patent: May 12, 2015

(54) COAXIAL FOUR-POINT PROBE FOR LOW RESISTANCE MEASUREMENTS

(75) Inventors: Michael Anthony Lamson, Anna, TX (US); Siva Prakash Gurrum, Dallas, TX (US); Rajiv Dunne, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 655 days.

(21) Appl. No.: 13/443,065

(22) Filed: Apr. 10, 2012

(65) Prior Publication Data

US 2012/0194208 A1 Aug. 2, 2012

Related U.S. Application Data

(62) Division of application No. 12/470,907, filed on May 22, 2009, now Pat. No. 8,174,276.

(60) Provisional application No. 61/055,307, filed on May 22, 2008, provisional application No. 61/155,214, filed on Feb. 25, 2009.

(51) Int. Cl.
  *G01R 1/06* (2006.01)
  *G01R 31/02* (2006.01)
  *G01R 31/20* (2006.01)
  *G01R 31/28* (2006.01)

(52) U.S. Cl.
  CPC ........ *G01R 31/2812* (2013.01); *G01R 31/2848* (2013.01); *G01R 31/2853* (2013.01)

(58) Field of Classification Search
  CPC .......... G01R 31/2812; G01R 31/2848; G01R 31/2853
  USPC ............... 324/715, 149, 72.5, 754.01–754.14
  See application file for complete search history.

(56) References Cited

U.S. PATENT DOCUMENTS 4,764,722 A * 8/1988 Coughlin et al. ........ 324/755.02

* cited by examiner

*Primary Examiner* — Melissa Koval
*Assistant Examiner* — Farhana Hoque
(74) *Attorney, Agent, or Firm* — Steven A. Shaw; Frank D. Cimino

(57) ABSTRACT

Various exemplary embodiments provide probes, systems and methods for measuring an effective electrical resistance/resistivity with high sensitivity. In one embodiment, the measuring system can include an upper probe set and a similar lower probe set having a sample device sandwiched therebetween. The device-under-test (DUT) samples can be sandwiched between two conductors of the sample device. Each probe set can have an inner voltage sense probe coaxially configured inside an electrically-isolated outer current source probe that has a large contact area with the sample device. The measuring system can also include a computer readable medium for storing circuit simulations including such as FEM simulations for extracting a bulk through-plane electrical resistivity and an interface resistivity for an effective electrical z-resistivity of the DUT, in some cases, having sub-micro-ohm resistance.

10 Claims, 5 Drawing Sheets

COAXIAL FOUR-POINT PROBE FOR LOW RESISTANCE MEASUREMENTS

RELATED APPLICATIONS

This application is a Divisional of and claims priority to U.S. patent application Ser. No. 12/470,907 filed May 22, 2009, which claims priority from U.S. Provisional Patent Application Ser. No. 61/055,307, filed May 22, 2008, and Ser. No. 61/155,214, filed Feb. 25, 2009. Said applications are hereby incorporated by reference in their entirety.

FIELD

Embodiments of the invention relate generally to electrical test probes and, more specifically, to a coaxial four-point probe as well as a system and a method for using the coaxial four-point probe to measure electrical resistances or resistivity.

BACKGROUND

Recently, increasing demand for high density and high performance electronic devices has spawned the development of complex, stacked, three dimensional (3D) package geometries. These emerging 3D packaging technologies require development of z-axis electrical interconnects for chip-to-chip, chip-to-substrate, and substrate vias. Because the electrical resistance of such interconnects (e.g., formed of conductive organic materials) is critical to the device operation, it is imperative to measure effective resistivity or conductivity of the electrical interconnects accurately. Typically, the effective resistivity is difficult to measure due to its strong dependency on z-thickness of the z-axis electrical interconnects, where interface resistivity plays significant role on the effective resistivity.

Various conventional methods have been used to measure the effective resistivity of z-axis electrical interconnects. One conventional method includes two copper wires placed on a substrate and separated by a small distance. Electrical interconnect, sample material or device under test (DUT) is placed in between the two copper wires and then measured. This method thus measures resistivity or resistance of the DUT across the two wires.

Another conventional method includes a four-point resistivity measurement by spreading DUT materials as a thin film on a glass substrate, and then using a Kelvin-probe setup with four contacts placed side-by-side on the cured thin film so as to measure its electrical resistivity. The measured resistivity generally refers to a bulk volume resistivity along an in-plane (x/y) direction of the DUT. Specifically, with this method, two source probes supply a constant current through the DUT and two high impedance sense probes measure the voltage drop across the DUT. The common current path between the source and sense probes is through the DUT, where current supplied by the source probes generates a relatively high voltage drop, which is seen by the high impedance sense probes.

Conventional methods further include a more advanced four-point resistivity measurement that uses lines patterned on two substrates. The individual substrates are bonded to form a sandwich structure with the DUT located in where the lines overlap or intersect each other. This method is able to measure through-plane electrical resistivity, i.e., along a z-axis direction of the DUT.

SUMMARY

The Applicants have realized that the conventional four-point resistivity measurement described above that uses four contacts placed side-by-side is good for measuring in-plane (x/y) resistivity, but does not capture through-plane z-resistivity or the interface resistivity. This is because the voltage drop generated from the sense probes, as compared with the voltage drop generated in the common path with the source probes, is very small due to the low current and the interface resistance at the contact. The interface resistance is then essentially removed from the measurement.

In another example described above for conventional measurements where two copper wires are placed on one substrate with DUT placed there-between, the measured resistivity of the DUT does not include through-plane (z) resistivity or interface resistivity. In the further example for conventional measurements involving the more advanced four-point resistivity measurement that uses patterned lines on two substrates, complicated test vehicles are required, although this method measures the electrical through-plane z-resistivity.

Thus, a new electrical test probe as well as a new measuring system and measuring method are needed to overcome these and other problems of the prior art and to more accurately address the effective electrical z-resistivity, which includes a bulk electrical z-resistivity and an interface resistivity.

In order to develop the new probe systems and methods, the Applicants have made a series of attempts. Initially, conventional Kelvin probes were attached to the DUTs using standard RF probes as known to one of ordinary skill in the art. The RF probes had two small point contacts on the sample surface, one for a source port and the other for a sense port. The source/sense probe set for the top surface of the DUT was different from the probe set for the bottom surface of the DUT, while the lower probe set was individually spring loaded to maintain contact with the DUT. Such system was tested using internal solder samples and dummy copper samples. However, the resistances measured did not show any difference across different samples, whether solders or conductive adhesives.

Modeling and analysis was then conducted in order to understand the measured resistance with the RF probe setup. The Laplace equation for voltage was solved using the Conductive Media DC module in COMSOL, a commercial Finite Element Method (FEM) software. The simulations indicated substantial current constriction and a major voltage drop near the source port input region of the DUT. Consequently, the voltage drop seen by the sense probe did not reflect the resistance contribution from the DUT.

Subsequently, to spread the current across a larger region of the DUT, the RF probe was removed and a source probe with an increased surface area (rather than a point contact) was added to the test set up while maintaining room on the DUT sample to contact the sense probe. This made the upper probe set the same configuration as the lower probe set. Such design was then subjected to the analysis by FEM modeling, which showed an improved current distribution through the DUT. The voltage profile from the modeling showed that the sense probe was in a high voltage gradient region and it was discovered that the sensitivity and linearity of the measurement was a strong function of the position of the sense probe with relative to the source probe.

For example, when the distance between the source probe and sense probe is minimized, measurement sensitivity increases since the probe senses higher voltage. But the measurements are more uncertain since the sense probe is in a high voltage-gradient region. When the sense probe rests in a low voltage gradient region away from the source probe, the four-point probe resistivity measurement has less uncertainty, but lacks the sensitivity since the probe is now in a low voltage region.

The Applicants then developed a coaxial four-point probe as well as a system and method for using the coaxial four-point probe to measure the effective resistivity. Such a coaxial probe has both less uncertainty and high sensitivity as described above. The inventive coaxial four-point probe can include an upper probe set and a lower probe set. The two probe sets can be essentially identical and can be coaxially configured to sandwich DUT in a common center along its z-axis direction when measuring.

Additionally, each coaxial probe set can include an inner sense probe and an outer source probe positioned in a close proximity but isolated from each other. In embodiments, the inner sense probe can be coaxially configured within the outer source probe. In embodiments, the outer source probe can process a large contact area for spreading current across a large region of the sandwiched DUT. In one embodiment, large annular conductive rings can form the outer current source surrounding the inner voltage sense probe.

The measuring system and method can further include a computer readable medium for storing circuit simulations, such as FEM simulations. In various embodiments, the circuit simulations or the exemplary FEM simulations can be used to extract an accurate value for each of the bulk z-axis resistivity, the interface resistivity, and thus the effective electrical z-resistivity of the DUT.

In this manner, the discovered coaxial four-point probe and the system/method for measuring an effective electrical resistivity, where an inner sense probe is placed in close proximity to but isolated from an outer source probe in a coaxial arrangement, have advantages over conventional probe systems/methods having side-by-side probe placement. For example, the inventive coaxial four-point probe can measure an effective electrical z-resistivity that includes a bulk z-axis resistivity, and a z-axis interface resistivity, while conventional four-point probe systems often do not capture both resistivities.

In addition, conventional probe systems use point contacts for resistivity measurement, while the disclosed coaxial probe system can have, for example, a flat surface with a surface area for the outer current source probe tip portion, providing a large contact area for spreading current across a large region of DUT.

Further, unlike conventional probe systems that may require complicated test vehicles, for example, having patterned structures on substrates, the disclosed coaxial four-point probe system can use a simple test device with no additional fabrication.

It is thus a technical advantage of various embodiments of the present teachings that the disclosed coaxial four-point probe measuring system/method can provide a high measurement sensitivity for electrical resistivity of, for example, conductive components used in IC package environments, such as for TSV (through-silicon via) contacts on conductive planes. In addition, the measurement sensitivity of conductive components/adhesives is important for developing low resistance polymer-based z-axis electrical interconnects for semiconductor packages or other applications.

It is also a technical advantage of various embodiments of the present teachings that the design and fabrication of the disclosed coaxial four-point probe configuration can allow simple test devices to be used for measuring low resistivity in a high sensitivity.

The technical advances represented by the present teachings, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

The accompanying drawings, which are incorporated in and constitute a part of this specification, illustrate embodiments of the invention and together with the description, serve to explain the principles of the invention. In the figures:

FIG. 1A depicts a close-up illustration of a portion of the coaxial electrical test probe of FIG. 1 in accordance with various embodiments of the present teachings;

FIG. 1B depicts an exemplary cross section of a tip portion of the test probe of FIGS. 1-1A in accordance with various embodiments of the present teachings;

It should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts.

In various embodiments, the disclosed electrical test probe can include an outer conductive sheath and a flexible inner conductor positioned coaxially within the outer conductive sheath having an insulating material or jacket positioned there-between for an electrical isolation and/or a mechanical guidance. The outer conductive sheath can include a hollow conductive tip portion at one end and the hollow conductive tip portion can include, for example, a flat surface having a surface area. The inner conductor can include an exposed inner conductive portion having a tip protruding through the hollow conductive tip portion of the outer conductive sheath and over the flat surface thereof. In addition, the coaxial electrical test probe can further include a spring surrounding the inner conductor to permit vertical deflection of the inner probe to accommodate simultaneous contact of the inner and outer conductor with the DUT.

Figure 1:
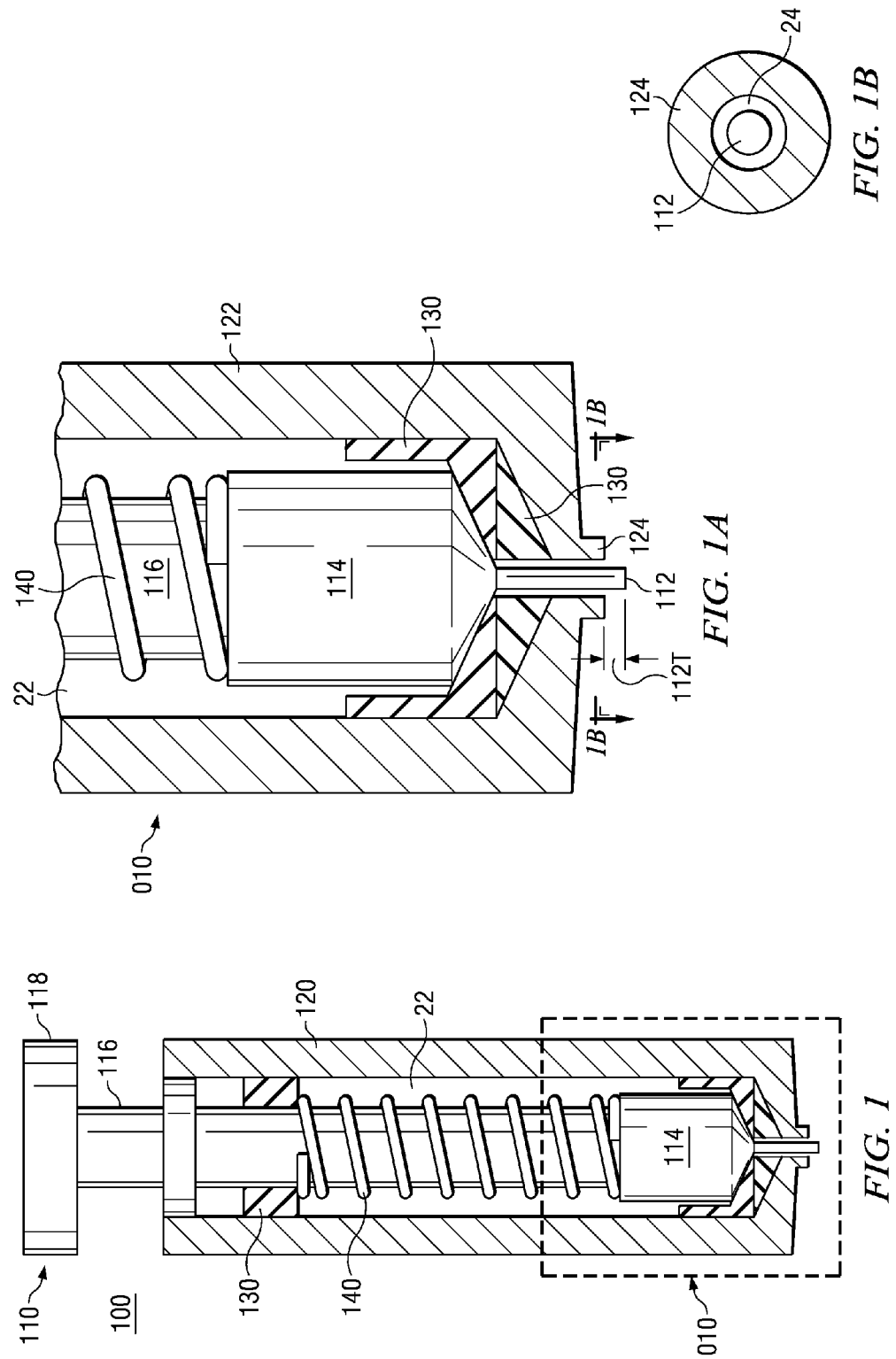
FIG. 1 depicts an exemplary coaxial electrical test probe in accordance with various embodiments of the present teachings.

FIG. 1 depicts an exemplary coaxial electrical test probe 100 in accordance with various embodiments of the present teachings. In addition, FIG. 1A depicts a close-up illustration of a portion 010 of the probe 100 in FIG. 1, while FIG. 1B depicts an exemplary cross section of a tip portion of the probe portion 010 in a direction of 1b-1b of FIG. 1A. It should be readily apparent to one of ordinary skill in the art that the probe 100 depicted in FIGS. 1-1B represents a generalized schematic illustration and that other components can be added or existing components can be removed or modified.

As shown in FIGS. 1-1A, the probe 100 can include an inner conductor 110 having interconnected portions that include an exposed inner conductive portion 112, an inner conductive segment 114, and an inner conductive shank 116. The inner conductive shank 116 can further connect to an electrical contact 118.

The probe 100 can also include an outer conductive sheath 120 that includes a hollow conductive tip portion 124 at one end of the outer conductive sheath 120. In addition, as shown in FIG. 1B, the hollow conductive tip portion 124 can include a surface having a surface area. In various embodiments, such surface that has a surface area may or may not be flat.

The inner conductor 110 can be positioned coaxially within the outer conductive sheath 120 having one or more insulating jackets or collars 130 positioned there-between for electrical isolation and/or for mechanical guidance of the inner conductor 110 within the outer conductive sheath 120. In the illustrated example, the insulating jackets 130 can be configured between the inner conductive shank 116 and the outer conductive sheath 120, between the inner conductive segment 114 and the outer conductive sheath 120, as well as between the exposed inner conductive portion 112 and the outer conductive sheath 120.

In various embodiments, there can be a hollow zone 22 inside the outer conductive sheath 120 that have sufficient, or in some cases minimum, radial separation to permit lateral deflection of the inner conductor 110 when an axial force is applied to the protruding tip 112T without contacting an inner wall of the hollow conductive tip portion 124 of the outer conductive sheath 120. In various embodiments, the hollow conductive tip portion 124 can include an axial borehole 24 for the protruding tip 112T of the exposed inner conductive portion 112 to pass through.

In various embodiments, the inner conductor 110 can be spring loaded by a mechanical spring 140 such that the inner conductor 110 can be independently floated inside the outer conductive sheath 120 to provide a flexible arrangement when it is against a surface or a device such as a sample device or DUT that generates an axial force. The mechanical spring 140 can be configured around at least a portion of the outer perimeter of the inner conductive shank 116 for varying a length of the protruding tip 112T. For example, the mechanical spring 140 surrounding at least a portion of the inner conductor 110 can allow an axial movement of the protruding tip 112T relative to the hollow conductive tip portion 124 of the outer conductive sheath 120 and to enable a simultaneous contact of the protruding tip 112T and the hollow conductive tip portion 124 with a sample material or a sample surface.

In various embodiments, the exposed inner conductive portion 112 of the inner conductor 110 can have a diameter ranging from about 0.01 mm to about 1 mm, with from about 0.1 mm to about 0.5 mm used for example, while the hollow conductive tip portion 124 of the outer conductive sheath 120 can have an outer diameter of about 0.05 mm to about 10 mm, with from about 0.5 mm to about 5 mm typically used, and a gap between the probes ranging from about 1 micron to about 250 microns, with from about 25 microns to about 150 microns used typically.

In an exemplary embodiment, the outer conductive sheath 120 can include a copper cylinder having a diameter of, for example, about 12.7 mm. The hollow conductive tip portion 124 can be made from such exemplary copper cylinder to have a diameter of, for example, about 2 mm on one end.

Although FIG. 1B depicts a circular cross-section for the exposed inner conductive portion 112, the axial borehole 24 and the hollow conductive tip portion 124, one of ordinary skill in the art would understand that the cross-section of each of these elements or other elements of the probe 100 is not limited and can include, for example, a square, an oval, a rectangle, a triangle, or a polygon cross-section.

In various embodiments, the coaxial electrical test probe 100 of FIGS. 1-1B can be used for measuring effective electrical z-resistivity and can be configured in a coaxial four-point probe system. For example, the outer conductive sheath 120 can be used as a current source probe having the hollow conductive tip portion 124 as a current source probe tip. The inner conductor 110 can be used as a voltage sense probe having the protruding inner conductive tip 112T as a voltage sense probe tip that makes contact to a sample device or a DUT. When measuring, a constant current can be forced to DUT through the current source probe (see 120/124), while the inner conductor 110, the voltage sense probe, can sense the voltage drop across the DUT.

Figure 2:
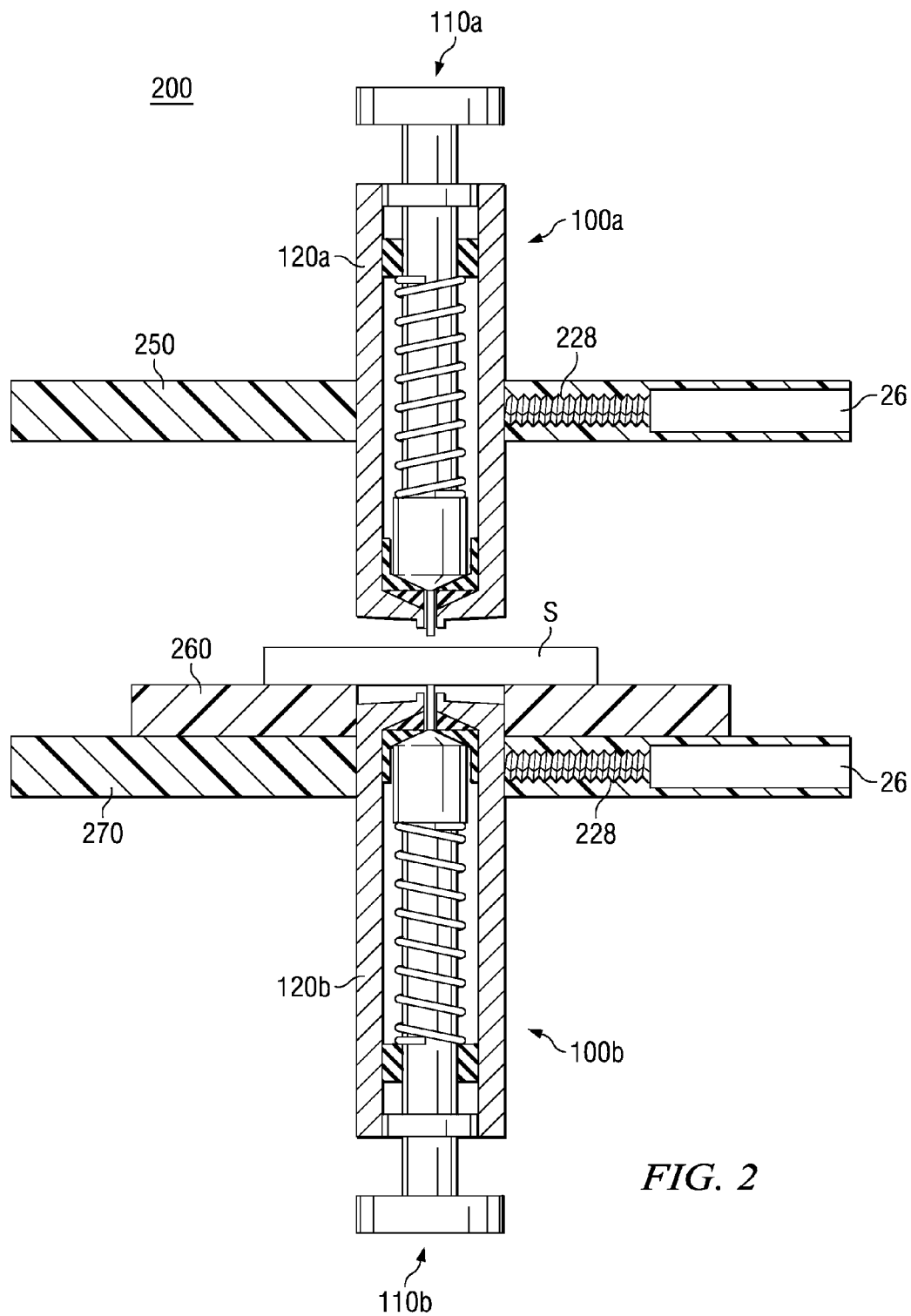
FIG. 2 depicts an exemplary coaxial four-point probe measuring configuration in accordance with various embodiments of the present teachings.

FIG. 2 depicts an exemplary coaxial four-point probe measuring configuration 200 in accordance with various embodiments of the present teachings.

As shown, the coaxial four-point probe measuring configuration 200 of FIG. 2 can include an upper probe set 100a and a lower probe set 100b having similar or essentially same configurations with each other. In embodiments, the structure for the upper and lower probe sets 100a-b can be similar to that shown in FIGS. 1-1B. In various embodiments, during a measurement, a sample device S configured with DUT can be sandwiched between the probe sets 100a and 100b.

In various embodiments, the voltage sense probe, e.g., the inner connector 110, can be coaxially configured within the current source probe, e.g., the outer conductive sheath 120 for each of the upper probe set 100a and the lower probe set 100b.

The disclosed measuring configuration 200 can have four probes including two voltage sense probes and two current source probes. In an exemplary embodiment, the two voltage sense probes 110a-b can include an upper sense probe 110a and a lower sense probe 110b that sandwich the sample device or DUT having a common center in z-axis direction. Likewise, the two current source probes 120a-b can include an upper source probe 120a and a lower source probe 120b that coaxially sandwich the sample device S having a common center in z-axis direction.

In various embodiments, the inner voltage sense probe 110 and the outer current source probe 120 can be positioned in a close proximity, e.g., in a space where at least the inner conductive tip portion 112 does not contact the inner wall of the hollow conductive tip portion 124 of the outer current source probe 120, when an axial force is applied to the protruding tip 112T. The inner voltage sense probe 110 and the outer current source probe 120 can be electrically isolated with each other. In addition, the outer current source probe 120 can process a large surface contact area for spreading a constant current across a large region of the DUT sample within the sample device S.

The coaxial probe measuring configuration 200 can also include a set of mechanical support for the coaxial probe sets 100a-b. As shown, the upper probe set 100a can be mounted in an insulating plate 250, such as a plastic, loosely attached and spring loaded (e.g., floating on springs) against an exemplary lower brass plate 270. The exemplary lower brass plate 270 can be used to support the lower coaxial probe set 100b. An insulating collar 260 can also be configured to guide the lower probe set 100b to maintain a common center on the sample device S or DUT with the upper probe set 100a. This allowed the upper probe set 100a to tilt as necessary and maintain flat contact against the sample device S or DUT for non-parallel sample surfaces.

The measuring configuration 200 can further include electrical contacts 228a-b contacting the outer current source probe 120a-b to provide an electrical contact. In the illustrated example, the electrical contact 228 can be configured in a screw channel 26 to maintain electrical contact with the outer perimeter of the current source probe 120 through the screw channel 26.

Figure 3A:
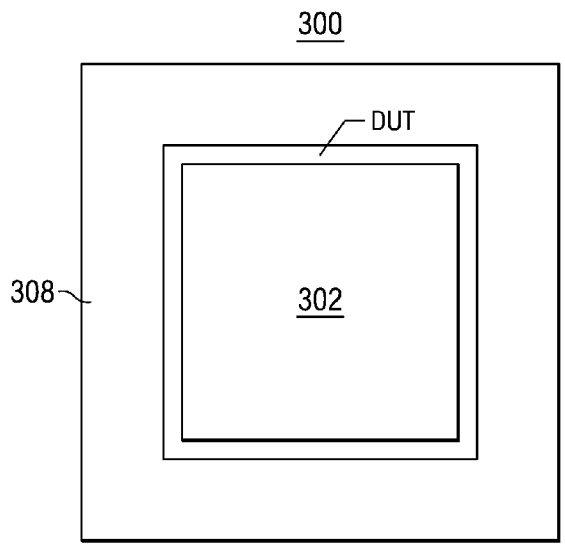
FIGS. 3A-3B depict an exemplary sample device in accordance with various embodiments of the present teachings.
Figure 3B:
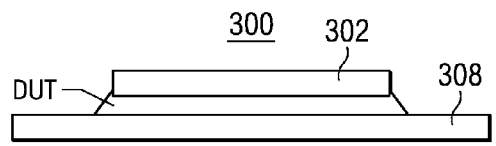

In embodiments, the sample device S can be designed to accommodate the disclosed coaxial four-point probe system, the circuit simulations and/or the DUT sample. FIGS. 3A-3B depict an exemplary sample device 300 in accordance with various embodiments of the present teachings. Specifically, FIG. 3A is a schematic of a top view and the FIG. 3B is a schematic of side view of the sample device 300. It should be readily apparent to one of ordinary skill in the art that the device 300 depicted in FIGS. 3A-3B represents a generalized schematic illustration and that other components can be added or existing components can be removed or modified.

The sample device 300 can include a top conductor 302 and a bottom conductor 308. In one embodiment, the bottom conductor 308 can possess a greater area than the top conductor 302. DUTs can then be placed or sandwiched between the top conductor 302 and the bottom conductor 308. In various embodiments, the conductors can include one or more metals with known electrical resistance or resistivity. Exemplary metal materials and their alloys used for the sample conductors can include, but are not limited to, copper, gold or aluminum.

The conductors 302 and 308 can be flat (e.g., a sheet, a film or a block) and can have various surface shapes including, but not limited to, a square, or a circular surface.

Figure 4:
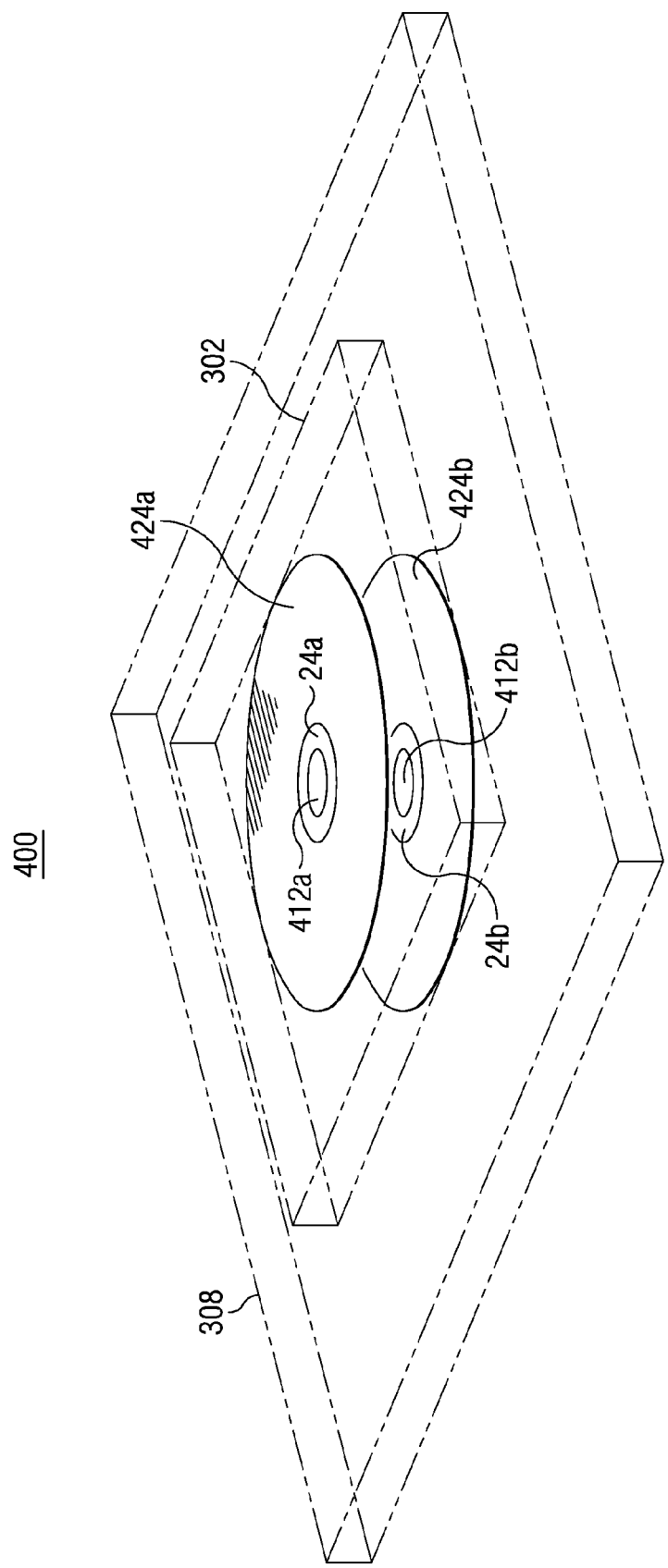
FIG. 4 depicts a coaxial four-point probe configuration model in accordance with various embodiments of the present teachings.

FIG. 4 depicts a coaxial four-point configuration model 400 showing an exemplary coaxial four-point probe contacting the exemplary sample device in accordance with various embodiments of the present teachings.

As shown, the configuration model 400 can include commonly centered upper and lower hollow current source probe tip portions 424a-b, commonly centered upper and lower voltage sense probe tip portions 412a-b, axial boreholes 24a-b between the current source probe tip portion 424 and the voltage sense probe tip portion 412. The upper voltage sense probe tip portion 412a can contact the top conductor 302 of the sample device and the lower voltage sense probe tip portion 412b can contact the bottom conductor 308 of the sample device, wherein the UDT or the exemplary testing conductive paste can be sandwiched between the top and bottom conductors 302 and 308.

In embodiments, the current source probe tip portion 424 can have a diameter of about 2 mm, which is in a range from about 0.05 mm to about 10 mm. Coaxially inside the current source probe tip portion 424, the borehole gap 24 between inner and outer probe can have a size of about 125 micron, which is in a range from about 1 micron to about 250 microns. Coaxially inside the borehole 24, the voltage sense probe tip portion 412 can have a diameter of about 0.5 mm, which is in a range from about 0.01 mm to about 1 mm. In embodiments, the voltage sense probe tip portion 412 is pressured by a mechanical spring attached to the inner probe for good contact with the sample device S or the DUT.

Such coaxial four-point probe measuring configuration can provide a "true" relationship between the sensed voltage drop and the effective electrical z-resistivity of the DUT, especially for small or thin samples. As disclosed, the "true" effective z-resistivity can be analyzed and determined by using circuit simulations, for example, the FEM simulations.

Figure 5:
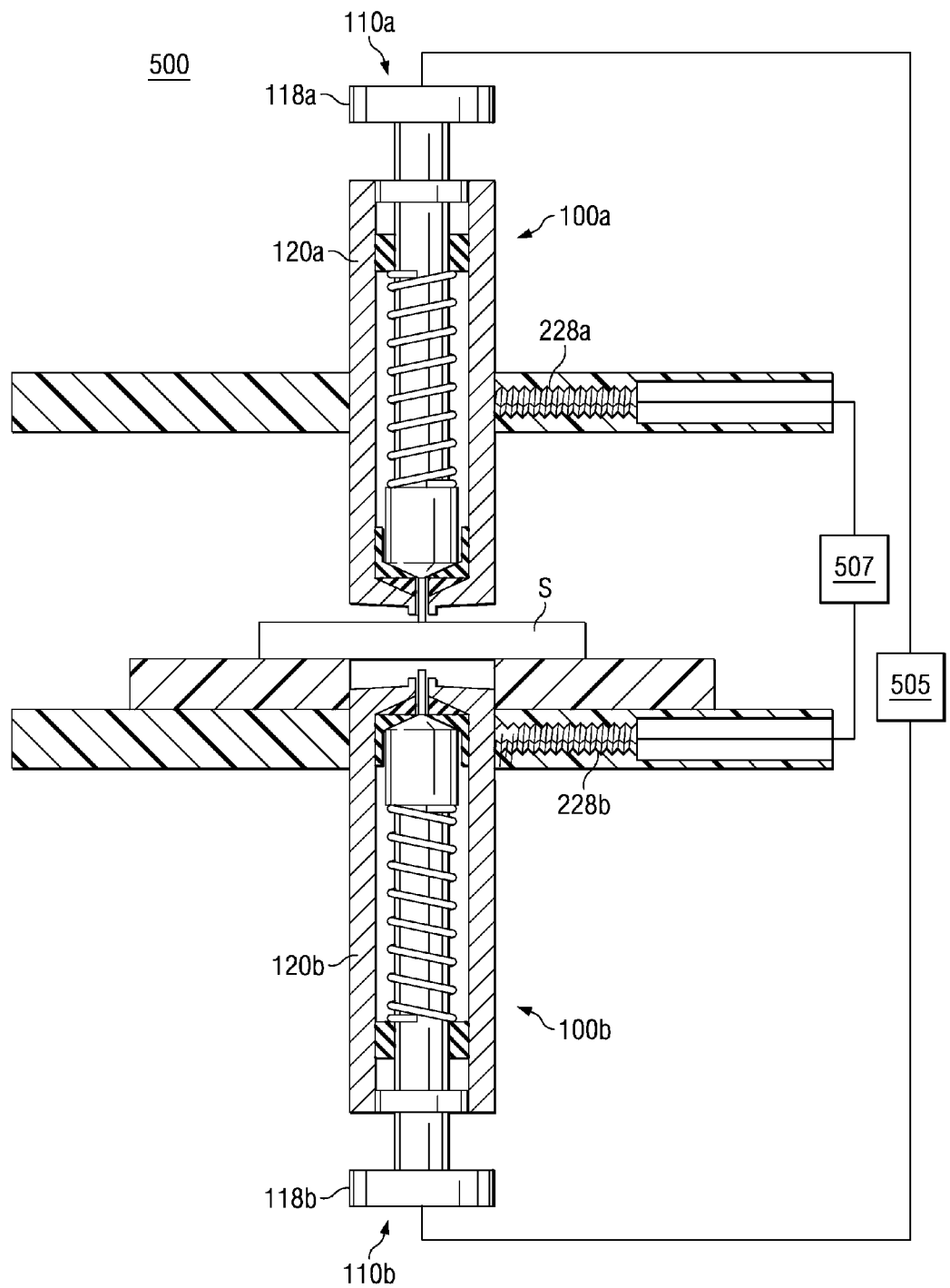
FIG. 5 depicts an exemplary system for measuring an effective electrical z-resistivity of a DUT in accordance with various embodiments of the present teachings.

FIG. 5 depicts an exemplary system 500 for measuring an effective electrical resistivity in z-direction direction of DUT in accordance with various embodiments of the present teachings.

As shown, the measuring system 500 can include a computer readable medium 505 for storing a circuit simulation. The computer readable medium 505 can be connected to the measuring configuration 200 as shown in FIG. 2, which includes an upper probe set 100a and a lower probe set 100b having a sample device S sandwiched there-between as disclosed herein. In various embodiments, the inner voltage sense probes 110a-b can be hooked to a nano-voltmeter (not shown) through the electrical contacts 118a-b to enable micro-ohm resistance measurements with high sensitivity.

The measuring system 500 can also include a current supply 507 connected to force a constant current to the upper current source probe 120a through electrical contact 228a. In one embodiment, the current supply 507 can be, e.g., a Keithley 2420 source meter (Cleveland, Ohio). In various embodiments, the lower current source probe 120b can be electrically grounded.

The circuit simulations stored in the computer readable medium 505 can include a model for analyzing, for example, the voltage drop across DUT sensed by the inner voltage sense probes 110a-b, and for extracting an effective electrical z-resistivity of DUT from a measured total electrical resistance. The effective electrical z-resistivity can include a bulk electrical z-resistivity and an interface resistivity, which can be determined separately. The circuit simulations can include FEM simulations used to determine the effective electrical resistivity of UDT.

In various embodiments, a table of total resistance can be generated from simulations for different values of thickness and effective electrical resistivity of DUT. This table can be used as a look-up interpolation table for the effective electrical z-resistivity as a function of measured total resistance and measured thickness. Using this procedure, the effective electrical z-resistivity values can be extracted for the sample DUT.

In various embodiments, the thickness of DUT can play an important role for determining the effective electrical z-resistivity. In one embodiment, as the thickness of DUT increases, the measured resistance increases linearly. When the thickness reduces, the interface contribution to total resistance can be increased and can be quantified.

To understand the behavior of effective electrical z-resistivity of DUT as a function of thickness, a simple one-dimensional interface resistance model can be used to fit to the data. For example, in this model, $R_{i1}$ denotes an interface resistance between the top conductor (see 302 in FIGS. 3-4) and DUT, while $R_{i1}$ denotes an interface resistance between DUT and the bottom conductor (see 308 in FIGS. 3-4) of the disclosed sample device. In this model, the total resistance can be expressed as following:

$$R_{Total} = \frac{\rho_{bulk} BLT}{Area} + (R_{i1} + R_{i2}) \quad (1)$$

where $\rho_{bulk}$ can be the bulk electrical z-resistivity of the sandwiched DUT and BLT can be a thickness of DUT. The effective resistivity of the sandwiched DUT material can then be written as:

$$\begin{aligned} \rho_{\textit{effective}} &= \rho_{bulk} + \frac{(R_{i1} + R_{i2})\text{Area}}{BLT} \\ &= \rho_{bulk} + \frac{r_i}{BLT} \end{aligned} \quad (2)$$

where $r_i=(R_{i1}+R_{i2})$ Area can be the interface resistance of a unit area. The extracted effective electrical Z-resistivity data can be used to fit both $\rho_{bulk}$ and $r_i$ respectively.

In various embodiments, the in-plane (x-y) electrical resistivity of DUT can be measured using a conventional four-point setup as known to one of ordinary skill in the art.

In various embodiments, the exemplary FEM simulations can indicate many advantages of the disclosed coaxial four-point probe system. For example, the sense probe average voltage can be comparable to the source probe average voltage, and can rest in a valley (low region) of voltage profile. The response curve plot from the exemplary FEM simulation shows an improved and acceptable sensitivity and linearity of the disclosed resistivity measurement.

Figure 6:
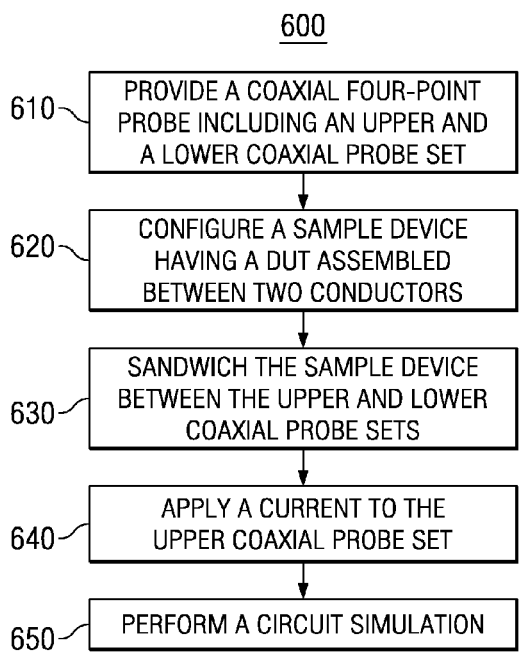
FIG. 6 depicts an exemplary method for measuring an effective electrical z-resistivity of a DUT in accordance with various embodiments of the present teachings.

Various embodiments can thus include a method for measuring an effective electrical z-resistivity as shown in FIG. 6. In the method 600 of FIG. 6, at 610, a coaxial four-point probe configuration including two essentially identical coaxial probe sets can be formed. Each probe set can include an inner voltage sense probe that is coaxially configured within and electrically isolated from an outer current source probe that has a large surface contact area with the DUT to be measured.

At 620, a sample device can be assembled by sandwiching the DUT between a top conductor and a bottom conductor.

At 630, the assembled sample device can be configured or sandwiched between the two essentially identical coaxial probe sets, wherein the inner voltage sense probes (or the outer current source probe) of the two coaxial probe sets have a common center across the sample device.

At 640, a constant current can be applied or forced to the DUT within the sample device through the current source probe of an upper coaxial probe set from a constant current supply. In an exemplary embodiment, fine stranded copper wires can be connected to a constant current supply to force the constant current to the upper current source probe through a connected electrical contact.

At 650, the voltage drop across the DUT within the sample device can then be sensed through the inner voltage sense probes and can be further analyzed using the circuit simulations stored in the computer readable medium. In various embodiments, a voltmeter can be connected to the inner voltage sense probe of each coaxial probe set for measuring the effective electrical resistance of about 0.1 micro-ohm or less. In some embodiments, the inner voltage sense probes can be hooked to a nano-voltmeter (e.g., a Keithley 2182A nano-volt meter, Cleveland, Ohio) to enable nano-ohm resistance measurements, for example, the measurable resistance in a nano-ohm level can be of about 100 nano-ohm or less.

Effective electrical resistivity values, e.g., the bulk electrical z-resistivity and/or the interface resistivity, can be extracted or determined by the circuit simulations, such as the FEM simulations.

In various embodiments, the measurable resistivity of the method 600 can be in a range from about 1 micro-ohm-cm to about 10000 micro-ohm-cm. In one embodiment, the method 600 can measure an effective electrical z-resistivity for a sample device having a thickness of about 50 microns to about 5000 microns and a sandwiched material (DUT) having a thickness of about 1 micron to about 1000 microns. The DUT can include, for example, metals, conductive pastes, eutectic solders, conductive polymers or any conductive materials.

The following examples are illustrative of the invention and its advantageous properties, and are not to be taken as limiting the disclosure or claims in any way.

EXAMPLES

The disclosed coaxial electrical test probe as well as its measuring systems and methods for effective electrical resistance/resistivity was used to measure a variety of conductive materials or DUTs. In some cases, known conductive materials were used to test or validate the disclosed four-point probe measuring system.

Example 1

Validation of Coaxial Four-Point Probe Measuring System

The coaxial probe setup and FEM modeling methodology were validated using metal brass and copper disks. These metal disks were cut and polished from long rods of 6.35 mm diameter. The resistances of these 12 inch long rods were first measured by other techniques using a simple one-dimensional expression $R=\rho L/A$. In this expression, R is the total measured resistance, $\rho$ is the electrical resistivity of the rod, L is the length of the rod, and A is the cross-sectional area of the rod. The resistivity of the brass rod was found to be 9.35 $\mu\Omega$-cm, and the copper rod was found to be 1.7 $\mu\Omega$-cm. The resistances of brass and copper disks made from these rods were then measured. A total resistance of 27.96±1.46 $\mu\Omega$ was measured for a 104 mils thick brass disk, and a resistance of 5.33±0.51 $\mu\Omega$ was measured for a 100 mils thick copper disk.

Using the electrical resistivity extracted from measurements on long rod specimens as described above, FEM simulations suggested that the total effective resistance measured by the coaxial four-point probe setup was 26.80 $\mu\Omega$ for brass disk and 4.78 $\mu\Omega$ for the copper disk. These measurements had deviations by 0.8 and 1.1 times the standard deviation for brass and copper disks respectively.

Example 2

Measurements of Conductive Polymer Adhesives and Solders

In this example, measurements were conducted on two different conductive adhesive materials A and B, using the disclosed coaxial four-point probe measuring system. These conductive adhesives had differences in their chemistry and filler particle morphology, with A having larger filler particles than B. Sn/Pb solder sample was also characterized to test accuracy of the disclosed measurement methodology, and to compare performance with the selected conductive adhesives.

The sample device was formed by dispensing the conductive paste A and B on a large lower copper conductor, followed by bonding of a small copper conductor as an upper conductor to form a sandwich structure. The conductive paste was then cured in a box oven. Different bonding forces were used to achieve DUT samples with a range of bond line thicknesses (BLT). For comparison and calibration purposes, the sample with eutectic Sn/Pb solder was also prepared.

Micro-section analysis was used to determine the bond line thickness for each sample, which is required for extracting the z-resistivity values.

To extract the effective electrical z-resistivity of the conductive adhesives, FEM simulations were used and a look-up interpolation table for electrical resistivity as a function of total resistance and BLT was used to obtain the effective resistivities of the conductive adhesives. It was also observed that there was an excellent correlation between the extracted and published resistivity of solder, which demonstrated that the methodology was capable of accurate z-axis electrical resistivity measurements. Note that other issues not germane to probe design, such as instrumentation and elimination of the thermal EMF generated in the sense probe connections may exist.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising."

Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for measuring an effective electrical resistivity comprising:
    providing a sample device comprising a top conductor and a bottom conductor such that a device under test (DUT) is able to be configured there-between for measuring an effective electrical resistivity of the DUT;
    providing a coaxial four-point measuring configuration comprising an upper coaxial probe set contacting the top conductor of the sample device and a lower coaxial probe set contacting the bottom conductor of the sample device, wherein the upper and lower coaxial probe sets have a common center across the sample device;
    sandwiching the sample device between the upper coaxial probe set and the lower coaxial probe set of the coaxial four-point probe configuration;
    wherein each of the upper and the lower coaxial probe sets comprises a flexible inner voltage sense probe that is electrically isolated from and coaxially configured within an outer current source probe; the outer current source probe comprising a hollow tip portion having a flat surface area; the inner voltage sense probe comprising an exposed inner conductive portion protruding through the hollow tip portion over the flat surface area;
    supporting the lower coaxial probe set with a lower brass plate surrounding the lower coaxial probe;
    surrounding the upper coaxial probe set with an upper insulating plate, comprising a plastic and is loosely attached and spring loaded against the lower brass plate;
    guiding the lower probe set with a lower insulating collar to maintain the common center with the upper probe set;
    applying a current to the upper coaxial probe set through the outer current source probe to the DUT within the sample device; and
    performing a circuit simulation to determine the effective electrical resistivity of the DUT.

2. The method of claim 1, wherein performing the circuit simulation comprises:
    measuring a total resistance of each of a plurality of DUTs through a sensed voltage drop across the DUT from the inner voltage sense probe;
    measuring a thickness of each corresponding DUT; and
    forming a lookup table for the effective electrical resistivity as a function of the measured total resistance and the measured thickness.

3. The method of claim 1, wherein performing the circuit simulation comprises extracting a bulk electrical z-resistivity and an interface resistivity of the DUT using a one-dimensional interface resistance model.

4. The method of claim 1, wherein the current is applied by connecting the upper outer current source probe to a constant current supply using a stranded copper wire, while the lower outer current source probe is electrically grounded.

5. The method of claim 1, further comprising connecting a voltmeter to the inner voltage sense probe of each coaxial probe set for measuring the effective electrical resistance of about 0.1 micro-ohm or less.

6. The method of claim 1, further comprising assembling a mechanical support for the coaxial four-point probe configuration, wherein the assembling comprises,
    surrounding the lower coaxial probe set with a lower brass plate;
    surrounding the upper coaxial probe set with an upper insulating plate, wherein the upper insulating plate is loosely attached and spring loaded against the lower brass plate; and
    guiding the lower coaxial probe set using a lower insulating collar to allow the lower coaxial probe set and the upper coaxial probe set to have a common center across the sample device.

7. The method of claim 1, further comprising measuring the effective electrical resistivity of a DUT that comprises a metal, a conductive paste, an eutectic solder, or a conductive polymer.

8. The method of claim 1, wherein the effective electrical resistivity is measured in a range of about 1 to about 10000 micro-ohm-cm for the sample device having a thickness of about 50 microns to about 5000 microns and for the DUT having a thickness of about 1 micron to about 1000 microns.

9. A system for measuring an effective electrical resistivity comprising:

a sample device for configuring a device under test (DUT) sandwiched between two metal conductors;

a coaxial four-point measuring configuration comprising an upper coaxial probe set and a lower coaxial probe set to sandwich the sample device there-between, wherein the upper coaxial probe set and the lower coaxial probe set are essentially identical and each coaxial probe set comprises, a flexible inner conductor positioned coaxially within an outer conductive sheath, wherein the outer conductive sheath comprises a hollow conductive tip portion that comprises a flat surface having a surface area, and wherein the flexible inner conductor comprises an inner conductive tip protruding through the hollow conductive tip portion of the outer conductive sheath and over the flat surface thereof a set of mechanical supports comprising:

a lower brass plate surrounding the lower coaxial probe set to support the lower coaxial probe set;

an upper insulating plate surrounding the upper coaxial probe set, wherein the upper insulating plate comprises a plastic and is loosely attached and spring loaded against the lower brass plate;

a lower insulating collar configured to guide the lower probe set to maintain the common center with the upper probe set; and a computer readable non-transitory medium for storing a circuit simulation, wherein the circuit simulation comprises a model for analyzing an sensed signal from the flexible inner conductor of each coaxial probe set and determining a bulk electrical z-resistivity and an interface resistivity of the DUT configured within the sample device.

10. The system of claim 9, wherein the circuit simulation comprises a Finite Element Method (FEM) simulation.

\* \* \* \* \*